US012580573B2

(12) United States Patent
Srinivasan Gopalan et al.

(10) Patent No.: US 12,580,573 B2
(45) Date of Patent: Mar. 17, 2026

(54) PHASE ALIGNING MULTIPLE CHANNEL DIVIDERS WITHOUT STOPPING VCO ROOT CLOCK

(71) Applicant: TEXAS INSTRUMENTS INCORPORATED, Dallas, TX (US)

(72) Inventors: Madusudanan Srinivasan Gopalan, Issaquah, WA (US); Christopher A. Schell, Tacoma, WA (US); Robert Karl Butler, Issaquah, WA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 4 days.

(21) Appl. No.: 18/344,510

(22) Filed: Jun. 29, 2023

(65) Prior Publication Data

US 2025/0007522 A1     Jan. 2, 2025

(51) Int. Cl.
*H03L 7/08* (2006.01)
(52) U.S. Cl.
CPC ...................................... *H03L 7/08* (2013.01)
(58) Field of Classification Search
CPC ........................................................ H03L 7/08
See application file for complete search history.

(56) References Cited

U.S. PATENT DOCUMENTS 5,539,328 A * 7/1996 Mirov ................. G06F 11/1604
327/292
2004/0252800 A1 * 12/2004 Kota ......................... H03L 7/18
375/354

FOREIGN PATENT DOCUMENTS

EP            1006750 A1 * 6/2000  ........... H04Q 11/045

* cited by examiner

*Primary Examiner* — Metasebia T Retebo
(74) *Attorney, Agent, or Firm* — Xianghui Huang; Frank D. Cimino

(57) ABSTRACT

In an example, a system includes one or more clock channels on a clock chip, each clock channel configured to provide a clock signal. The system also includes a signal line coupled to the one or more clock channels, the signal line configured to send clock signals to and receive clock signals from each clock channel. The system includes a controller configured to select a first clock signal from a first clock channel to drive the signal line. The system also includes divider timing synchronization circuitry in a second clock channel configured to align a second clock signal from the second clock channel with the first clock signal.

21 Claims, 5 Drawing Sheets

104

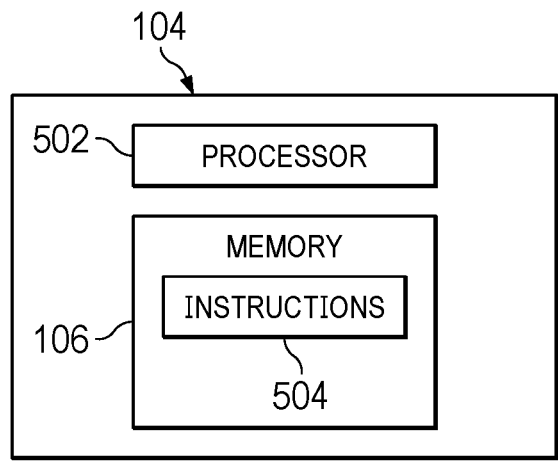

502 ~ PROCESSOR

MEMORY

INSTRUCTIONS

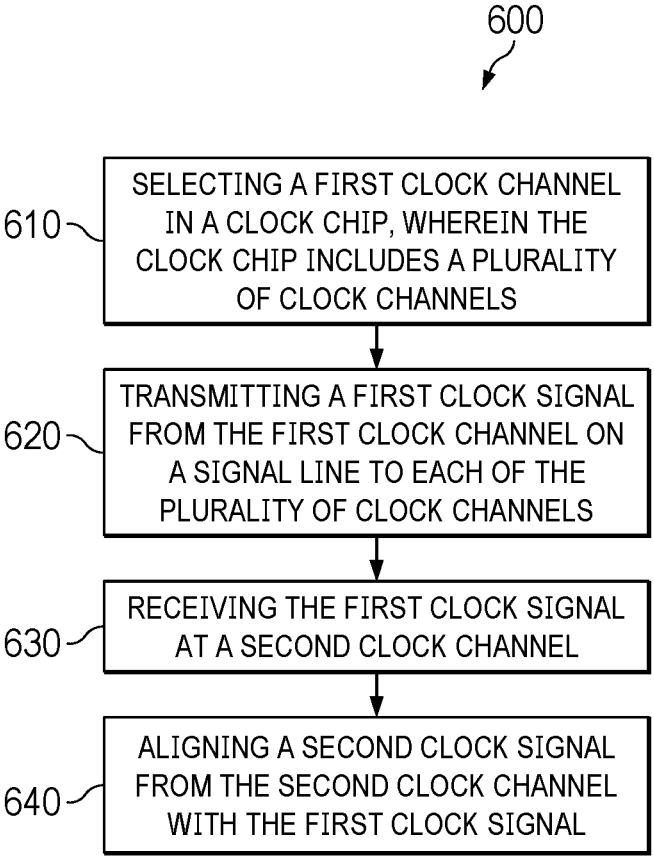

610 ~ SELECTING A FIRST CLOCK CHANNEL IN A CLOCK CHIP, WHEREIN THE CLOCK CHIP INCLUDES A PLURALITY OF CLOCK CHANNELS

620 ~ TRANSMITTING A FIRST CLOCK SIGNAL FROM THE FIRST CLOCK CHANNEL ON A SIGNAL LINE TO EACH OF THE PLURALITY OF CLOCK CHANNELS

630 ~ RECEIVING THE FIRST CLOCK SIGNAL AT A SECOND CLOCK CHANNEL

640 ~ ALIGNING A SECOND CLOCK SIGNAL FROM THE SECOND CLOCK CHANNEL WITH THE FIRST CLOCK SIGNAL

FIG. 6

PHASE ALIGNING MULTIPLE CHANNEL DIVIDERS WITHOUT STOPPING VCO ROOT CLOCK

BACKGROUND

Clock chips are integrated circuits that provide clock generation, jitter cleaning, advanced clock monitoring, and switching performance to meet the timing requirements of subsystems coupled to the clock chip. A clock chip may have one or more phase-locked loops (PLL) for generating multiple output clock signals at various frequencies. A clock chip may have twenty or more outputs that provide output clock signals to the subsystems.

SUMMARY

In accordance with at least one example of the description, a system includes a controller and a phase-locked loop. The system includes one or more clock channels, each clock channel coupled to the controller and to the phase-locked loop. The system also includes a signal line coupled to the one or more clock channels. Each clock channel includes a channel driver coupled to a clock channel output, divider timing synchronization circuitry, and an interface coupled to the divider timing synchronization circuitry and the signal line.

In accordance with at least one example of the description, a system includes one or more clock channels on a clock chip, each clock channel configured to provide a clock signal. The system also includes a signal line coupled to the one or more clock channels, the signal line configured to send clock signals to and receive clock signals from each clock channel. The system includes a controller configured to select a first clock signal from a first clock channel to drive the signal line. The system also includes divider timing synchronization circuitry in a second clock channel configured to align a second clock signal from the second clock channel with the first clock signal.

In accordance with at least one example of the description, a method includes selecting a first clock channel in a clock chip, where the clock chip includes a plurality of clock channels. The method also includes transmitting a first clock signal from the first clock channel on a signal line to each of the plurality of clock channels. The method includes receiving the first clock signal at a second clock channel. The method also includes aligning a second clock signal from the second clock channel with the first clock signal.

BRIEF DESCRIPTION OF THE DRAWINGS

FIG. 5 is a block diagram of a digital controller in accordance with various examples.

FIG. 6 is flow diagram of a method for aligning channel clocks in accordance with various examples.

The same reference numbers or other reference designators are used in the drawings to designate the same or similar (functionally and/or structurally) features.

DETAILED DESCRIPTION

Clock chips may produce multiple clock outputs (e.g., clock channels) to power multiple subsystems, such as up to 20 clock channels in some chips. As one example, a clock chip in a server rack may provide clock signals to solid state drives (SSDs), peripheral component interconnect express (PCIe) devices, and a backplane. It is useful for components in the server rack to have synchronized clocks to know when packets are sent or received (e.g., precision timestamps). If a user wishes to replace a component in the server rack (such as an SSD) and then restart the component, or wishes to restart another component for any reason (such as a fault), the clock channel for that component is shut down. Upon restart, the clock channel for that component should be aligned with the root clock for the clock chip and with the other clock channels. In some systems, the entire clock chip or the root clock may have to be stopped and then restarted to realign the restarted clock channels with the other clock channels. Restarting the root clock or the clock chip to align a clock channel causes downtime for the entire system.

In examples herein, restarted clock channels may be aligned without disturbing the root clock or other clock channels. A tri-statable signal line in the clock chip connects each clock channel to every other clock channel. Any channel clock may be sent to a second clock channel on the signal line and used as a reference to align the second clock channel. The channel dividers in the second clock channel are aligned with the reference signal and then a divide ratio may be updated to provide a clock output at the second clock channel that is aligned with the reference clock.

The examples herein provide for channel dividers in a clock channel to be changed to any output frequency and aligned to other channel dividers without stopping the root clock or other clock channels. Clocks may be realigned without restarting the system. Clock channels may power up in any state and the processes described herein will align the clock. After alignment, the clock channels may be changed to have any arbitrary phase relationship by adding phase offsets. These examples provide the ability to predictably, synchronously, and glitchlessly update channel dividers in a clock channel to any divide ratio and maintain a known phase relationship.

Figure 1:
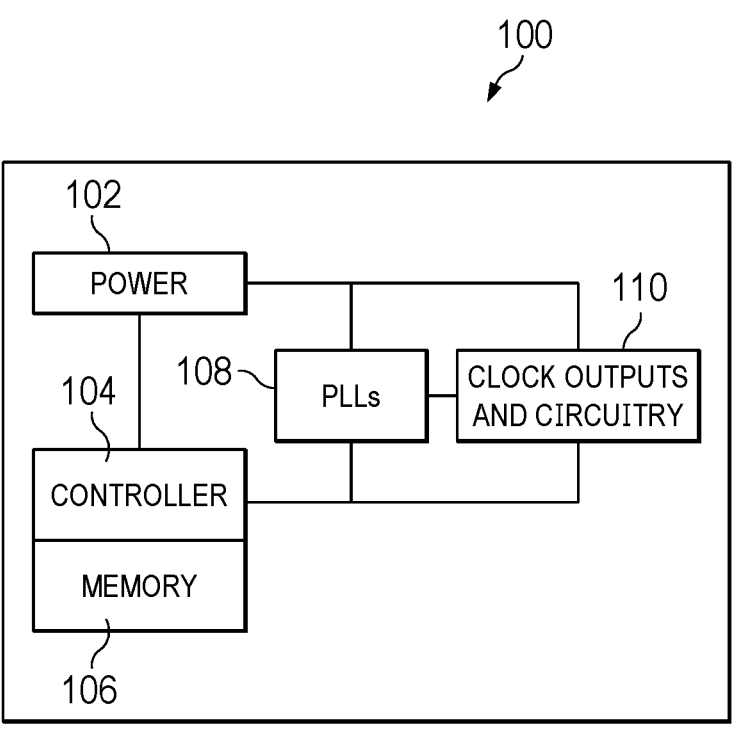
FIG. 1 is a block diagram of a clock chip in accordance with various examples.

FIG. 1 is a block diagram of a clock chip 100 in accordance with various examples herein. Clock chip 100 includes power circuitry 102, controller 104, memory 106, PLLs 108, and clock outputs and circuitry 110. Clock chip 100 may be an integrated circuit that provides clock signals at its clock outputs. Clock chip 100 may include any number of pins for input and output (not shown in FIG. 1). Clock chip 100 may provide clock signals at a variety of frequencies and in various formats. Clock chip 100 may include various interfaces to communicate with subsystems or other components, such as serial peripheral interface (SPI) or Inter-Integrated Circuit (I2C). Clock chip 100 may be useful for synchronous optical networking (SONET), synchronous digital hierarchy (SDH) application, and optical transport network applications. Clock chip 100 may be useful in or with telecom and enterprise line cards, wireless base stations, testing and measurement equipment and broadcast infrastructure. Clock chip 100 may provide jitter attenuation, frequency translation, and clock generation for field programmable gate arrays (FPGAs), digital signal processing (DSP), application-specific integrated circuits (ASICs), and central processing unit (CPU) devices.

Power circuitry 102 provides power to the various components in clock chip 100. Controller 104 controls other components of clock chip 100, such as PLLs 108 and clock outputs and circuitry 110. Controller 104 may execute instructions stored in memory 106. Memory 106 may include any combination or type of memory, such as read-only memory (ROM), random access memory (RAM), Flash memory, static RAM (SRAM), electrically-erasable programmable read-only memory (EEPROM), etc. PLLs 108 may provide programmable loop bandwidths for input jitter and wander attenuation and fractional-N PLL frequency synthesis to generate any output frequency from any input frequency. PLLs 108 may include multiple PLL channels. A PLL channel may have multiple phase-locked loops that include any number of digital PLLs (DPLLs) and any number of analog PLLs (APLLs) with a low-noise integrated voltage-controlled oscillator (VCO). PLLs 108 provide a root clock signal to clock channels in clock chip 100.

Clock outputs and circuitry 110 includes any number of clock channels. Some clock chips 100 may have 20 or more clock channels. The clock channels may include programmable drivers (not shown in FIG. 1). Clock outputs and circuitry 110 also includes circuitry described herein that provides for dynamically phase aligning multiple channel dividers without stopping a root clock or disturbing other clock channels. In examples herein, a signal line (described below) in clock chip 100 connects each clock channel to every other clock channel. Any channel clock may be sent to a second clock channel on the signal line and used as a reference to align the second clock channel. The channel dividers in the second clock channel are aligned with the reference signal and then a divide ratio may be updated to provide a clock output at the second clock channel that is aligned with the reference clock. The structure and operation of the circuitry that performs these processes is described below.

Figure 2:
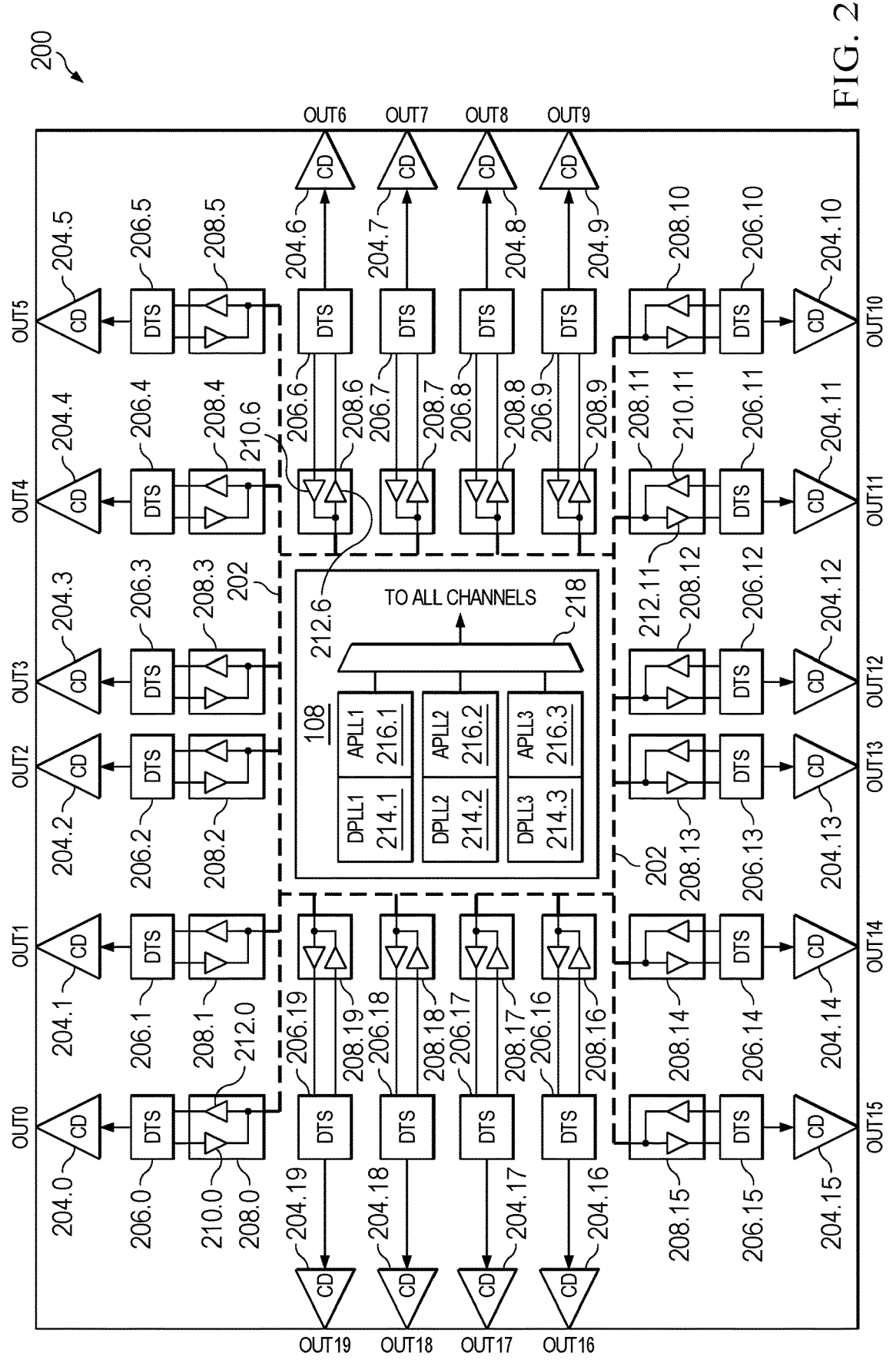
FIG. 2 is a system for aligning clock channels in accordance with various examples.

FIG. 2 is a system 200 for aligning clock channels in accordance with various examples herein. System 200 includes circuitry and components in clock chip 100 described above with respect to FIG. 1, and like numerals denote like components. System 200 includes PLLs 108, signal line 202, channel drivers (CD) 204, divider timing synchronization (DTS) circuitry 206 (e.g., circuitry 206), and bus interface 208. Each bus interface 208 includes drive circuitry 210 and receive circuitry 212. PLLs 108 includes any number of DPLLs 214, any number of APLLs 216, and multiplexer 218.

Each clock channel includes a channel driver 204, circuitry 206, bus interface 208, drive circuitry 210 and receive circuitry 212. System 200 shows 20 clock channels, but any number of clock channels may be included in other examples. The clock channels are labeled OUT0 to OUT19, to represent the 20 clock output channels. System 200 includes 20 channel drivers (CD) 204, which are labeled 204.0 to 204.19, to correspond to the 20 clock output channels. System 200 includes 20 circuitry 206 components, which are labeled 206.0 to 206.19, to correspond to the to the 20 clock output channels. System 200 includes 20 bus interfaces 208, which are labeled 208.0 to 208.19, to correspond to the 20 clock output channels. Each bus interface 208 includes drive circuitry 210 and receive circuitry 212. In FIG. 2, only a select few of drive circuitry 210 and receive circuitry 212 are labeled for simplicity, but the drive circuitry 210 and receive circuitry 212 for the 20 channels operate similarly. Signal line 202 is a bus that couples each clock channel to every other clock channel via the respective bus interface 208 of each clock channel. Signal line 202 may be a tri-statable bus. A tri-statable buffer or device that connects to signal line 202 has three outputs states: a high output state, a low output state, and a high impedance state. In the high impedance state, the output of the buffer or device is disconnected from the signal line 202, allowing other devices to drive the signal line 202 without interference from the tri-state device. Tri-statable devices and the tri-statable bus are useful in situations where multiple devices are connected to the same bus (e.g., signal line 202) and need to take turns accessing it, such as with the examples described herein.

In operation, DPLLs 214 and APLLs 216 produce a root clock signal that is provided to all clock channels. Each clock channel produces an output clock (OUT0 to OUT19). The clocks produced by the 20 clock channels may have the same frequency as another clock channel or may have different frequencies. During operation, the clock chip 100 produces clock signals for various subsystems coupled to the clock chip 100. If a subsystem is shut down for replacement, repair, testing, fault, etc., the clock channel for that subsystem is shut down. Upon restart, the clock channel for that component is aligned with the root clock for the clock chip 100 and with the other clock channels in accordance with the examples herein.

As an example, clock channel OUT6 may be shut down to replace a subsystem. Power can be turned off to OUT6 and the clock channel is shut down. Clock chip 100 and the other clock channels are still operating properly while OUT6 is shut down. After the subsystem is replaced, OUT6 is restarted. Upon restart, OUT6 should be aligned with the other clocks produced by clock chip 100, without disturbing the other clocks or the root clock. Signal line 202 couples the clock channels to one another. To restart OUT6 in alignment with the other clock channels, a reference clock is selected by controller 104 (not shown in FIG. 2). OUT11 may be chosen as the reference clock, for example. In that case, bus interface 208.11 uses drive circuitry 210.11 to drive the clock signal from clock channel OUT11 to signal line 202. Bus interfaces 208 may include any suitable circuitry or digital logic that allows a clock channel to be selected to provide its clock signal to signal line 202, which is then provided to all other clock channels by signal line 202. Receive circuitry 212 for every other clock channel (except for OUT11) would be active and every other clock channel would receive the clock signal produced by OUT11 on signal line 202. If another clock channel is operational and does not need alignment, that clock channel can ignore the clock signal produced by OUT11 and provided by signal line 202. Also, that clock channel's bus interface 208 can be placed in a high impedance state due to the tri-statable nature of the devices. However, if another clock channel needs alignment, such as clock channel OUT6, that other clock channel can use its bus interface 208 to receive the clock signal from OUT11 and use the OUT11 clock as a reference signal for alignment.

Any clock channel may be used by another clock channel as a reference for alignment. The clock channel selected for alignment may have the same frequency as the restarting clock channel. In the example above, if OUT6 should produce a clock signal of 100 MHZ, and OUT11 is producing a clock signal of 100 MHZ, then OUT11 may be a proper selection as a reference clock for OUT6. However, clock channels at other frequencies may be selected as a reference clock for OUT6, and the channel dividers in OUT6 can set OUT6 to its selected frequency after alignment. For example, if OUT6 is producing a clock signal of 100 MHZ, and only a 50 MHz reference clock is available, OUT6 can be aligned with the 50 MHz clock and then the channel dividers in clock channel OUT6 can produce the 100 MHz output clock signal. If multiple clocks are to be aligned at the same time (such as OUT6 and OUT7), a reference clock signal may be selected that is the lowest common multiple frequency of the two clocks to be aligned. Then, multiple clocks could be aligned simultaneously with one reference clock signal driving signal line 202.

Figure 3:
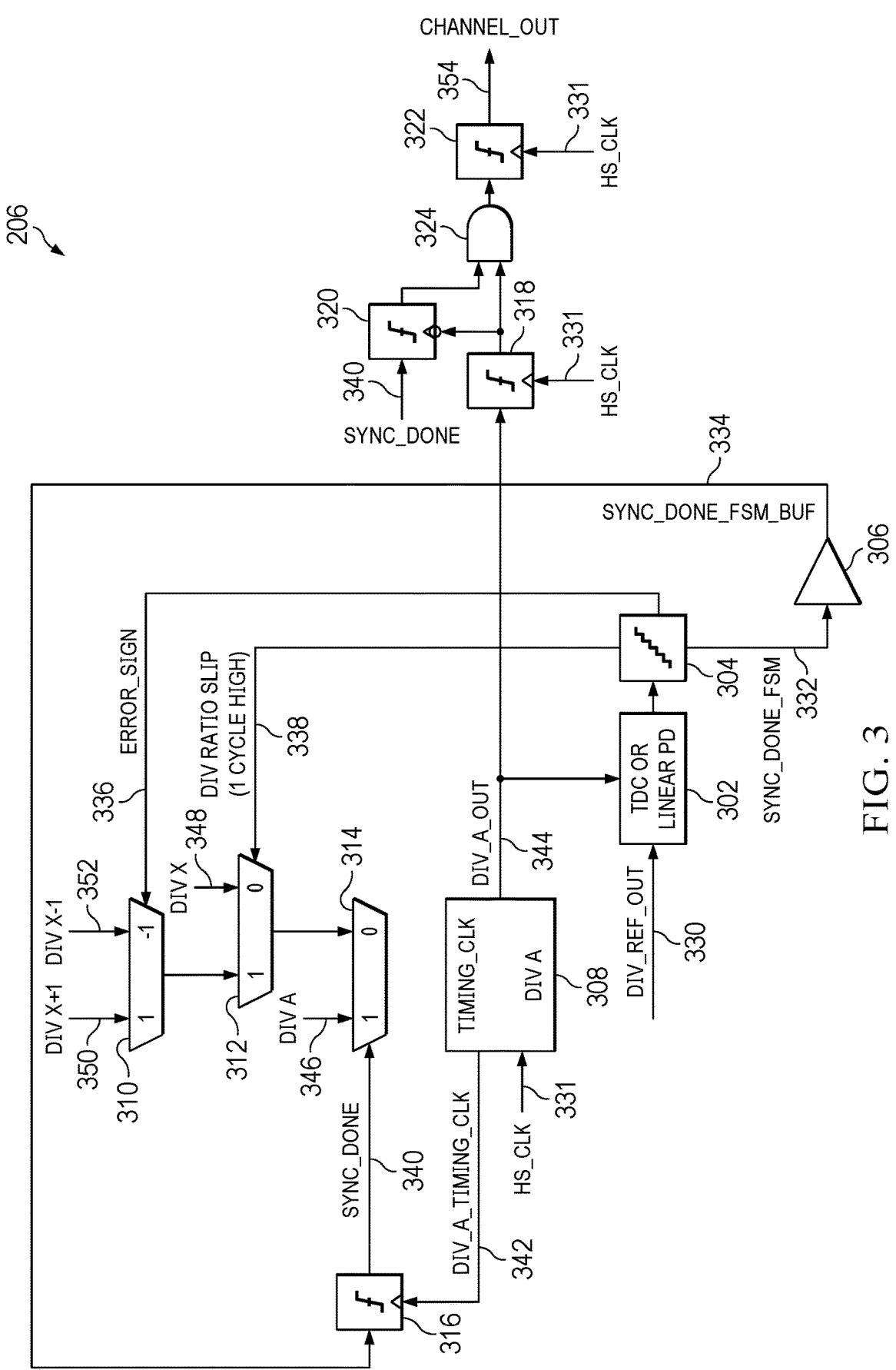
FIG. 3 is block diagram of divider timing synchronization circuitry in accordance with various examples.

The alignment process is performed by DTS circuitry 206. Each clock channel in system 200 has DTS circuitry 206, but in other examples a clock channel may share DTS circuitry 206 with another clock channel. DTS circuitry 206 may include any suitable circuitry or digital logic configured to perform the actions herein, such as aligning a clock channel with a reference clock signal. FIG. 3, described below, provides one example of DTS circuitry 206. However, DTS circuitry 206 may be different in other examples. In one example, DTS circuitry 206 provides for comparing the clock signal from the stopped clock channel to the reference clock signal received on signal line 202. DTS circuitry 206 can let the clock signal that is to be aligned slip or delay by a clock cycle repeatedly until its rising edge is aligned with a rising edge of the reference clock signal. After alignment, the frequency or phase of the stopped clock channel may be adjusted, if needed, and the stopped clock channel may be restarted in alignment with the other clock channels, without disturbing the other clock channels or the root clock.

FIG. 3 is a block diagram of divider timing synchronization (DTS) circuitry 206 in accordance with various examples herein. DTS circuitry 206 includes a time-to-digital converter (TDC) 302, which may also be a phase detector in other examples. DTS circuitry 206 also includes error block 304, buffer 306, channel dividers 308, multiplexers 310, 312, and 314, latches 316, 318, 320, and 322, and gate 324. FIG. 3 also shows a number of signals, including reference clock 330 (DIV_REF_OUT), high speed clock 331 (HS_OUT), sync done 332 (SYNC_DONE_FSM), sync done buffer 334 (SYNC_DONE_FSM_BUF), error sign 336 (Error_Sign), divider ratio slip 338 (DIV_RATIO_SLIP), sync done 340 (SYNC_DONE), divider A timing clock 342 (DIV_A_TIMING_CLK), divider A output 344 (DIV_A_OUT), divider A 346 (DIV A), divider X 348 (DIV X), divider X+1 350 (DIV X+1), divider X−1 352 (DIV X−1), and output channel clock signal 354 (CHANNEL_OUT).

DTS 206 receives a reference clock 330 and compares it to the output clock from the channel dividers 308 (divider A output 344). Based on the error between the two clocks, divider A output 344 is adjusted until it is aligned with the reference clock 330. Then, the final divide ratio for the output clock signal is set, and the output channel clock signal 354 may be produced. DTS 206 provides example circuitry for performing the alignment described herein, but other circuitry or digital logic may be useful in other examples.

In operation, if a clock channel A should be aligned with a reference clock using DTS 206, controller 104 selects a reference clock from another clock channel to drive signal line 202. The reference clock on signal line 202 produced by the other clock channel is received by DTS 206 at TDC 302 at a first input. The reference clock 330 is the signal received from signal line 202. Reference clock 330 is received at TDC 302, which compares reference clock 330 to the output clock from channel dividers 308, shown here as divider A output 344 (DIV_A_OUT), which is received by TDC 302 at a second input. TDC 302 compares reference clock 330 and divider A output 344 to determine if the edges of the two input signals are aligned. The rising edge is used as an example herein, but a falling edge could be used as well. If the edges of the two input signals to TDC 302 are not aligned, error block 304 produces an output signal error sign 336 which indicates which of the two input signals is ahead of the other. Error sign 336 is used to increment or decrement divider A output 344 repeatedly until it is aligned with reference clock 330. If the rising edge of reference clock 330 arrives first, error block 304 produces a decrement signal (X−1) at its output. If divider A output 344 comes first, error block 304 produces an increment (X+1) signal at its output. Error sign 336 is provided to multiplexer 310. The cycle of the clock signal divider A output 344 is adjusted by applying either a divider X+1 350 signal or a divider X−1 352 signal at multiplexer 310. The cycle of the clock signal divider A output 344 is continually adjusted one cycle at a time until divider A output 344 is aligned with reference clock 330.

As an example, if the final frequency of the clock channel A is 100 MHZ, the divider A is a divide by 16, and the reference clock 330 is also 100 MHZ, then reference clock 330 is also running at the same divider ratio of divide by 16. This means there are 15 other edges where divider A could start if divider A output 344 is not aligned with reference clock 330. TDC 302 determines if the rising edge of divider A output 344 appears first or if the rising edge of reference clock 330 appear first. If divider A output 344 is first, divider A output 344 should slip and be delayed. The rising edge of divider A output 344 will then move for the next clock cycle and the next comparison by TDC 302. This process repeats until the clock signals provided to TDC 302 are aligned.

After TDC 302 determines that the clock signals are aligned, error block 304 indicates that the process is complete and provides a sync done 332 signal (SYNC_DONE_FSM) to buffer 306. Buffer 306 provides an output signal sync done buffer 334 (SYNC_DONE_FSM_BUF) to latch 316. After receipt of the sync done buffer 334 signal, latch 316 produces a sync done 340 signal (SYNC_DONE). The sync done 340 signal is provided to multiplexer 314 to indicate that the clock signal divider A output 344 is aligned with the reference clock 330. If the clock signal divider A output 344 should be multiplied to produce a higher frequency, the divider A 346 (DIV A) signal provides the channel divider ratio at this time to produce the proper output frequency for clock channel A.

The sync done 340 signal from latch 316 is also provided to latch 320. The divider A output 344 is provided to latch 318. Latch 318 produces an output signal provided to latch 320 and to a second input of AND gate 324. This output signal is divider A output 344. Latch 320 receives divider A output 344 and sync done 340, and produces an output signal after sync done 340 goes high (e.g., after the clocks are aligned). Therefore, after sync done 340 goes high, AND gate 324 receives a high signal at its first input (from latch 320) and a high signal at its second input (from latch 318, which is the divider A output 344 signal). With both of its inputs receiving high signals, AND gate 324 then opens, and produces an output signal to latch 322. One high speed clock 331 signal later, latch 322 provides the output channel clock signal 354 (CHANNEL_OUT), which is the output signal produced by clock channel A in this example.

Therefore, when sync done 340 goes to 1, the divide ratio A (divider A 346) is applied. On the next falling edge of the divider A output 344 signal, AND gate 324 is enabled by latch 320. Latch 322 samples on the next falling edge of high speed clock 331 and lets the output channel clock signal 354 go out. At that time, clock channel A is again operational and aligned with the other clocks in the system.

In one example, clock channel A may be aligned with a reference clock signal 330 that is the same frequency as the desired output of clock channel A. But if channel A is 100 MHZ, and there is no other 100 MHz clock available on clock chip 100, controller 104 may select another clock frequency for alignment. If a 25 MHz frequency clock is available for a reference, the clocks May be aligned at the lower frequency of 25 MHZ. Channel dividers 308 are started with the same divide ratio as the reference clock (in this case, the divide ratio that produces a 25 MHZ clock). The alignment is performed first, and the clocks are aligned at 25 MHZ. Then, the divider A 346 signal is activated at the next rising edge by the sync done 340 signal from latch 316. The divide ratio of A sets the divider A output 344 clock to 100 MHZ, or any selected multiple of 25 MHZ in other examples.

In DTS 206, the output of multiplexer 310 is provided to multiplexer 312. Multiplexer 312 also receives a divider ratio slip 338 signal from error block 304. During an alignment process, error sign 336 signifies whether divider A output 344 is early or late. The controller (such as controller 104) that determines the error may be running at a much lower frequency. The controller therefore sends the divider ratio slip 338 to indicate that divider A output 344 is running late if the error sign 336 keeps getting produced. The divider ratio slip 338 signal is provided for one cycle and then shuts off. This one pulse indicates to slip a cycle, and then the system will enable the divider X 348 signal. The adjustment for divider A output 344 could happen over some period of time depending on how fast the controller runs.

Figure 4:
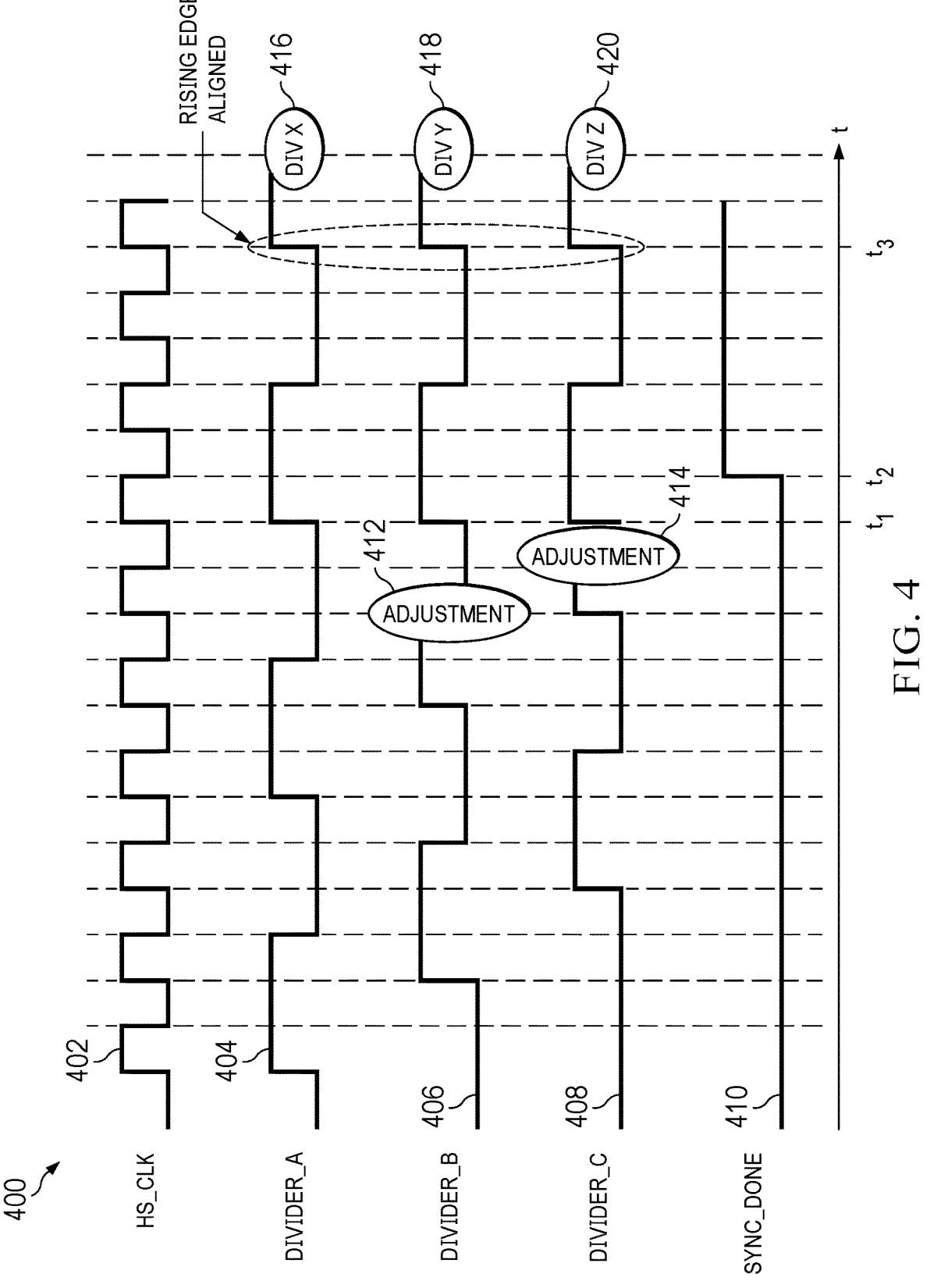
FIG. 4 is a graph of waveforms for aligning clocks in accordance with various examples.

FIG. 4 is a graph 400 of waveforms for aligning clocks in accordance with various examples herein. Graph 400 includes various waveforms through time (t). FIG. 4 includes waveforms 402, 404, 406, 408, and 410. In this example, waveform 402 (HS_CLK) represents a root clock such as high speed clock 331. Waveform 404 represents a first clock channel (DIVIDER_A), waveform 406 represents a second clock channel (DIVIDER_B), and waveform 408 represents a third clock channel (DIVIDER_C). Waveform 410 (SYNC_DONE) represents a sync done signal such as sync done 340 described above.

In this example, the second clock channel (DIVIDER_B) and the third clock channel (DIVIDER_C) are to be aligned with the first clock channel (DIVIDER_A). Waveform 406 shows that the second clock channel has a rising edge two HS_CLK cycles after the rising edge of the first clock channel (waveform 404). Waveform 408 shows that the third clock channel has a rising edge two HS_CLK cycles before the rising edge of the first clock channel (waveform 404). Therefore, both the second clock channel and the third clock channel need adjustment to align with the first clock channel.

FIG. 4 shows that an adjustment process 412 is performed for the second clock channel, and an adjustment process 414 is performed for the third clock channel. The adjustment processes 412 and 414 may be similar to the adjustment process described above with respect to FIG. 3. After the adjustment processes 412 and 414 are complete, the rising edges of all three clock channels are aligned at time $t_1$. At time $t_2$, the SYNC_DONE signal (waveform 410) goes high to indicate that the clocks are aligned. In this example, only one SYNC_DONE signal is shown, but in other examples each of the second and third clock channels has its own SYNC_DONE signal (e.g., sync done 340, described above).

At time $t_3$, graph 400 shows that the rising edges of the three clocks are aligned. After alignment, divide ratios 416, 418, and/or 420 may be implemented to produce the appropriate output frequencies for the three clock channels.

FIG. 5 is a block diagram of a digital controller, such as controller 104, in accordance with various examples herein. Controller 104 may include a processor 502 and memory 106 in this example. Controller 104 may include one or more processors 502 and one or more memories 106 in other examples. Memory 106 may include any suitable data, code, logic, or instructions 504. The processor 502 may read and execute computer-readable instructions. For example, the processor 502 may invoke and execute instructions in a program stored in the memory 106, including instructions 504. Instructions 504 may perform the actions described herein, such as selecting a reference clock signal and performing an alignment operation.

In an example, the memory 106 may be integrated with the processor 502. The memory 106 may store various software programs and/or multiple groups of instructions, including the instructions 504. The memory 106 may store the instructions 504 for implementing the various methods and processes provided in accordance with the various examples of this description.

In another example, elements of controller 104 disclosed herein may use any combination of dedicated hardware and instructions stored in a non-transitory medium, such as memory 106. The non-transitory medium includes all electronic mediums or media of storage, except signals. Processor 502 may include one or more microcontrollers, application-specific integrated circuits (ASICs), CPUs, graphics processing units (GPUs), and/or other processing resources configured to execute instructions 504 stored on the medium. Examples of suitable non-transitory computer-readable media include one or more flash memory devices, battery-backed RAM, solid state drives (SSDs), hard disk drives (HDDs), optical media, and/or other memory devices suitable for storing the instructions 504 for the processor 502.

FIG. 6 is a flow diagram of a method 600 for aligning channel clocks in accordance with various examples herein. The steps of method 600 may be performed in any suitable order. The hardware components described above with respect to FIGS. 1-3 and/or 5 may perform method 600 in some examples. Any suitable hardware, software, or digital logic may perform method 600 in some examples.

Method 600 begins at 610, where a controller, such as controller 104, selects a first clock channel in a clock chip, where the clock chip includes a plurality of clock channels. The controller 104 selects the first clock channel to serve as a reference clock to align another channel.

Method 600 continues at 620, where a signal line transmits a first clock signal from the first clock channel to each of the plurality of clock channels. Controller 104 can enable drive circuitry so the first clock channel can drive the signal line and provide its first clock signal to other clock channels for alignment. The signal line may be a tri-statable signal line in some examples.

Method 600 continues at 630, where a second clock channel receives the first clock signal. The second clock channel is configured to align its second clock signal with the first clock signal.

Method 600 continues at 640, where circuitry or digital logic aligns a second clock signal from the second clock channel with the first clock signal. The alignment process described above with respect to FIG. 3 may be useful in some examples for aligning the second clock signal. In other examples, different circuitry or digital logic that aligns clock signals may be useful. Any suitable method for aligning clock signals may be performed in the examples herein.

The examples herein provide for channel dividers in a clock channel to be changed to any output frequency and aligned to other channel dividers without stopping the root clock or other clock channels. Clocks may be realigned without restarting the clock chip. Clock channels may power up in any state and the processes described herein will align the clock. After alignment, the clock channels may be changed to have any arbitrary phase relationship by adding phase offsets. The examples herein provide the ability to predictably, synchronously, and glitchlessly update channel dividers in a clock channel to any divide ratio and maintain a known phase relationship.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

While certain components may be described herein as being of a particular process technology, these components may be exchanged for components of other process technologies. Circuits described herein are reconfigurable to include the replaced components to provide functionality at least partially similar to functionality available prior to the component replacement.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A system, comprising:
a controller;
a phase-locked loop;
clock channels coupled to the controller and to the phase-locked loop; and
a signal line coupled to the clock channels, wherein each clock channel includes:
  a channel driver coupled to a clock channel output;
  divider timing synchronization circuitry coupled to the channel driver, the divider timing synchronization circuitry having an input coupled to the phase-locked loop; and
  an interface coupled to the divider timing synchronization circuitry and the signal line.

2. The system of claim 1, wherein the interface includes drive circuitry coupled to the signal line.

3. The system of claim 1, wherein the interface includes receive circuitry coupled to the signal line.

4. The system of claim 1, wherein the divider timing synchronization circuitry includes a time-to-digital converter coupled to the signal line.

5. The system of claim 1, wherein the signal line is coupled to the phase-locked loop.

6. A system, comprising:
clock channels on a clock chip, each clock channel configured to provide a clock signal;
a tri-statable signal line coupled to the clock channels, the tri-statable signal line configured to transport clock signals;
a controller configured to select a first clock signal from a first clock channel to transport on the tri-statable signal line; and
divider timing synchronization circuitry in a second clock channel configured to align a second clock signal from the second clock channel with the first clock signal.

7. The system of claim 6, wherein the divider timing synchronization circuitry includes a time-to-digital converter configured to receive the first clock signal and the second clock signal.

8. The system of claim 7, wherein the time-to-digital converter is configured to determine an error between the first clock signal and the second clock signal.

9. The system of claim 8, wherein the divider timing synchronization circuitry is configured to adjust a rising edge of the second clock signal based on the error.

10. The system of claim 6, further comprising:
a channel divider in the divider timing synchronization circuitry configured to adjust a frequency of a clock signal received by the divider timing synchronization circuitry.

11. The system of claim 6, wherein the controller is configured to select the first clock signal based at least in part on a frequency of the first clock signal.

12. The system of claim 6, further comprising:
receive circuitry in the second clock channel configured to receive the first clock signal from the tri-statable signal line.

13. A method, comprising:
selecting a first clock channel in a clock chip, wherein the clock chip includes a plurality of clock channels;
transmitting a first clock signal from the first clock channel on a signal line coupled to each of the plurality of clock channels;
receiving the first clock signal at a second clock channel; and
aligning a second clock signal from the second clock channel with the first clock signal wherein aligning the second clock signal includes determining a phase error between the first clock signal and the second clock signal.

14. The method of claim 13, further comprising:
adjusting a divide ratio in the second clock channel to set a frequency of the second clock signal.

15. The method of claim 13, wherein the signal line is a tri-statable signal line.

16. The method of claim 13, wherein a controller selects the first clock channel based on a divide ratio of the first clock signal and the second clock signal.

17. The method of claim 13, wherein aligning the second clock signal includes aligning the second clock signal without stopping the first clock signal or a root clock in the clock chip.

18. An apparatus comprising:
a root clock generator having an output;
a signal line; and a first clock channel including:

first channel clock generator circuitry having a clock input coupled to the output of the root clock generator and having a clock output coupled to the signal line; and alignment circuitry having an alignment error indicator output, and a time-to-digital converter (TDC) having first and second clock inputs, the first clock input of the TDC coupled to the signal line, the second clock input of the TDC coupled to the clock output of the first channel clock generator circuitry; and a second clock channel including second channel clock generator circuitry having a clock input coupled to the output of the root clock generator and having a clock output coupled to the signal line.

19. The apparatus of claim 18, wherein the alignment circuitry is first alignment circuitry, and the second clock channel includes second alignment circuitry having first and second clock inputs and an alignment error indicator output, the first clock input of the second alignment circuitry coupled to the signal line, the second clock input of the second alignment circuitry coupled to the clock output of the second channel clock generator circuitry.

20. The apparatus of claim 18, wherein the first channel clock generator circuitry is configured to adjust a frequency of a clock signal received by the first clock channel.

21. The apparatus of claim 18, wherein the root clock generator is a phase-locked loop.

\* \* \* \* \*